United States Patent
Kim

[19]

[11] Patent Number: 6,151,243
[45] Date of Patent: Nov. 21, 2000

[54] FERROELECTRIC MEMORY DEVICE HAVING FOLDED BIT LINE ARCHITECTURE

[75] Inventor: Jae Whan Kim, Ichon-shi, Rep. of Korea

[73] Assignee: Hyundai Electronics Industries Co., Ltd., Ichon-shi, Rep. of Korea

[21] Appl. No.: 09/428,546

[22] Filed: Oct. 28, 1999

[30] Foreign Application Priority Data

Oct. 28, 1998 [KR] Rep. of Korea ................. 98-45292

[51] Int. Cl.[7] ................. G11C 11/22; H01L 29/76; H01L 27/108
[52] U.S. Cl. ................. 365/145; 365/63; 257/295; 257/300
[58] Field of Search ................. 365/145, 149, 365/63, 51; 257/295, 303, 300

[56] References Cited

U.S. PATENT DOCUMENTS

| | | | |
|---|---|---|---|
| 5,541,872 | 7/1996 | Lowrey et al. | 365/145 |
| 5,767,541 | 6/1998 | Hanagasaki | 257/295 |
| 5,852,571 | 12/1998 | Kinney | 365/145 |
| 5,969,380 | 10/1999 | Seyyedy | 257/295 |
| 5,990,507 | 11/1999 | Mochizuki et al. | 257/295 |
| 5,990,508 | 11/1999 | Shinohara | 257/295 |
| 6,015,990 | 1/2000 | Hieda et al. | 257/310 |

FOREIGN PATENT DOCUMENTS

| | | |
|---|---|---|
| 7-287999 | 10/1995 | Japan . |
| 7-335767 | 12/1995 | Japan . |
| 8-213487 | 8/1996 | Japan . |
| 9-148541 | 6/1997 | Japan . |
| 9-266285 | 10/1997 | Japan . |
| 10-106275 | 4/1998 | Japan . |
| 10-162587 | 6/1998 | Japan . |

*Primary Examiner*—Son Mai
*Attorney, Agent, or Firm*—Jacobson, Price, Holman & Stern, PLLC

[57] ABSTRACT

A ferroelectric memory device includes a plurality of groups of active areas, each active area having two memory cells, and a plurality of pairs of conductive lines arranged in a parallel fashion, each conductive line having a word line and a plate line, wherein a pair of the word line and the plate line are isolated through an insulating layer, wherein each group of the active areas are coupled to each pair of the conductive lines, thereby having a folded bit line architecture without increasing a chip size.

10 Claims, 6 Drawing Sheets

6,151,243

FERROELECTRIC MEMORY DEVICE HAVING FOLDED BIT LINE ARCHITECTURE

FIELD OF THE INVENTION

The present invention relates to a semiconductor memory device; and, more particularly, to a ferroelectric memory device which has a folded bit line architecture without increasing a chip area.

DESCRIPTION OF THE PRIOR ART

Ferroelectric memory devices are calling attention as a next-generation memory devices. Generally, a cell structure of FeRAM (ferroelectric random access memory) is similar to that of DRAM (dynamic random access memory). However, a capacitor material for the FeRAM is different from that for the DRAM. That is, the FeRAM uses a ferroelectric material as a capacitor dielectric to thereby obtain a non-volatile characteristic.

The FeRAM may be incorporated into a ferroelectric memory array. One known architecture for the formation of the ferroelectric memory array is an open bit line architecture. Another known architecture for the formation of the ferroelectric memory array is a folded bit line architecture. As is well known to those skilled in the art, the folded bit line architecture is less susceptible to electrical noise than the open bit line architecture.

FIG. 1 is a circuit diagram illustrating a memory cell of a typical FeRAM. A reference numeral BL represents a bit line, WL1 and WL2 word lines, and PL a plate line. Each memory cell includes one transistor and one capacitor and two word lines WL1 and WL2 is corresponded to one plate line PL1. That is, each memory cell connected to the neighboring word lines WL1 and WL2 uses commonly one plate line PL.

If the word line WL1 is continuously selected while the word line WL2 is not selected, voltage pulses should be applied to the plate line PL as many times as the word line WL1 is selected to read out the data stored in the memory cells. In such a case, data stored in a ferroelectric capacitor C2, which is coupled to the word line WL2, may be destroyed. If a storage node $N_j$ of the ferroelectric capacitor C2 is perfectly floated, problem may not occur, but the storage node $N_j$ is actually grounded through a parasitic junction capacitor $C_j$. For example, if a capacity ratio of the capacitor C2 to the parasitic junction capacitor $C_j$ is 9:1 and a voltage of the plate line PL swings in the range of 0 V to 3 V, a voltage at the storage node $N_j$ swings in the range of 0 V to 2.7 V. Therefore, a voltage of 0.3 V is repeatedly applied to the ferroelectric capacitor C2, so that the data stored in the ferroelectric capacitor C2 is gradually destroyed.

For solving the fundamental problem, described above, it has been proposed a FeRAM cell structure having each word line using one plate line, respectively. However, the proposed FeRAM cell structure substantially doubles the number of the plate lines, increasing a chip area. Therefore, it is difficult to implement the FeRAM having a folded bit line architecture without increasing the chip area.

FIG. 3A is a circuit diagram illustrating a conventional FeRAM cell array. Although the FeRAM cell array is implemented with the folded bat line architecture, two word lines is corresponded to one plate line.

FIG. 3B is a diagram illustrating a layout of the conventional FeRAM cell array described in FIG. 3A. Reference numerals A, B and C represent bit line contacts, 30 a storage node, 32 an active area, 34 a storage node contact, and α a minimum pitch between the plate lines.

SUMMARY OF THE INVENTION

It is, therefore, an object of the present invention to provide a ferroelectric memory device which has a folded bit line architecture without increasing a chip area.

In accordance with an embodiment of the present invention, there is provided a ferroelectric memory device, comprising: a plurality of groups of active areas, each active area having two memory cells; and a plurality of pairs of conductive lines arranged in a parallel fashion, each conductive line having a word line and a plate line, wherein a pair of the word line and the plate line are isolated through an insulating layer, wherein each group of the active areas are coupled to each pair of the conductive lines.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
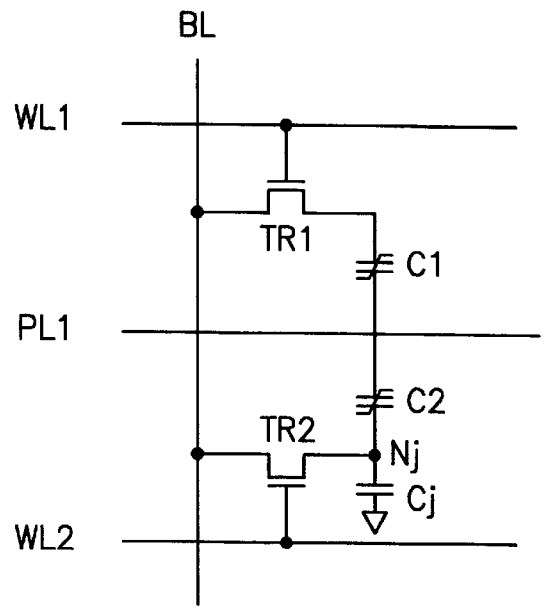
FIG. 1 is a circuit diagram illustrating a conventional FeRAM cell structure.
Figure 2:
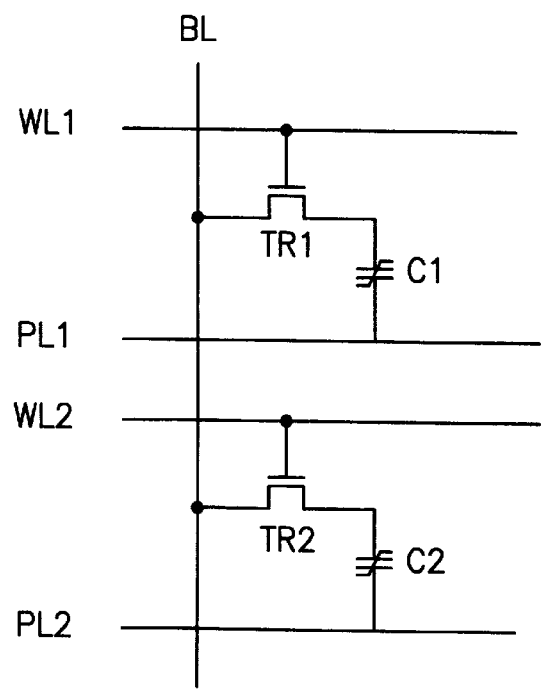
FIG. 2 is a circuit diagram illustrating a FeRAM cell structure for improving a parasitic junction capacitor.
Figure 3A:
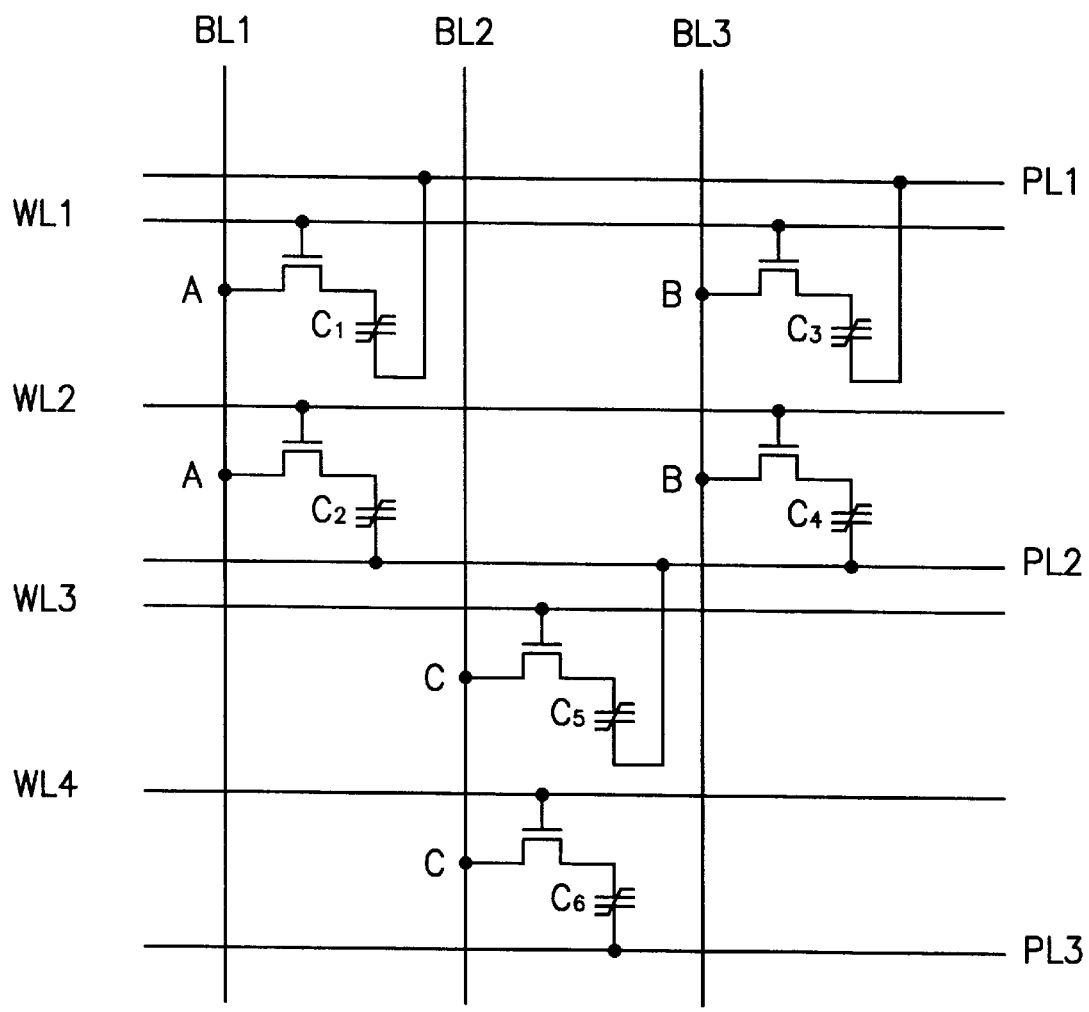
FIG. 3A is a circuit diagram illustrating a conventional FeRAM cell array based on a cell structure shown in FIG. 1.
Figure 3B:
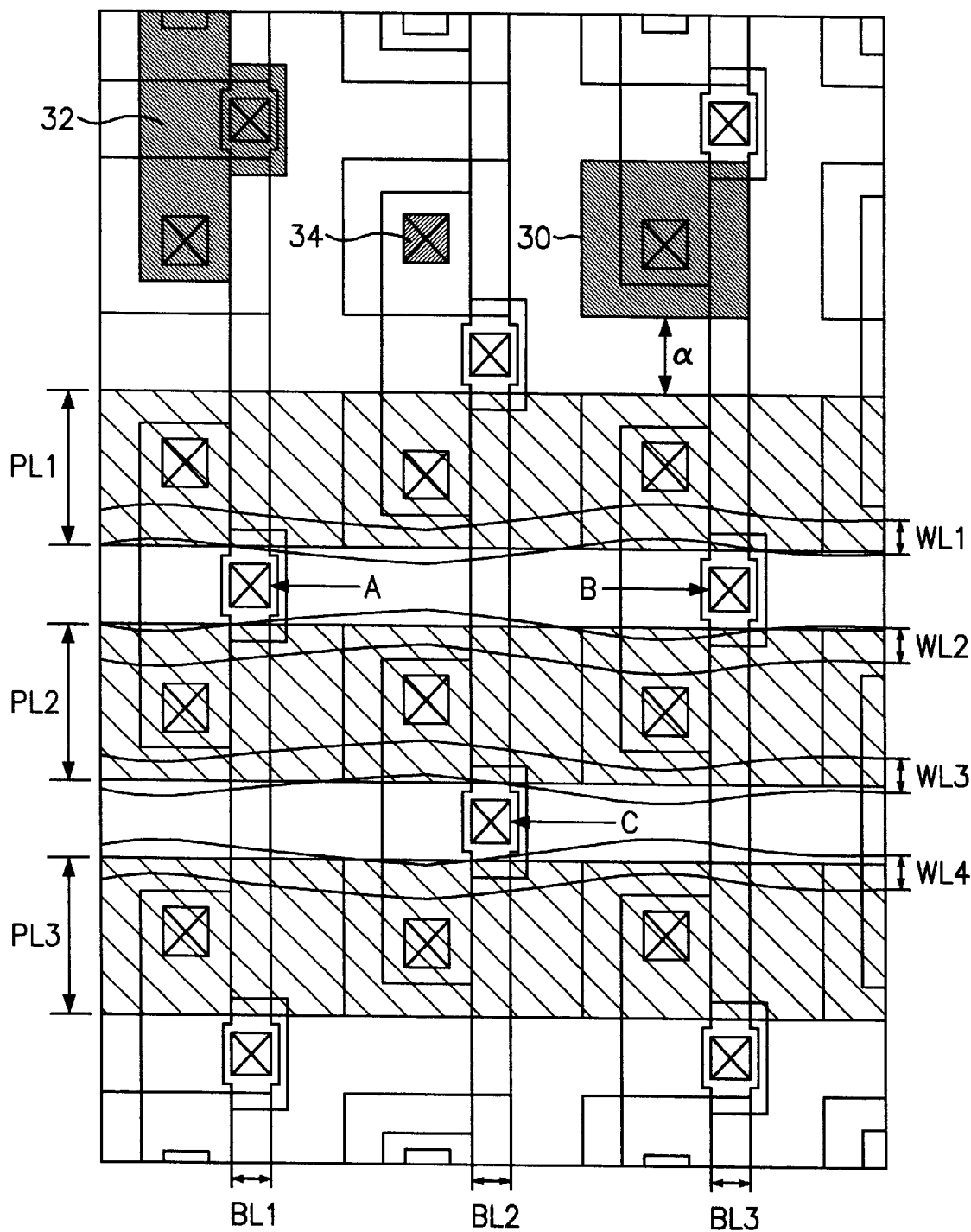
FIG. 3B is a diagram illustrating a layout of a conventional FeRAM cell array shown in FIG. 3A.
Figure 4A:
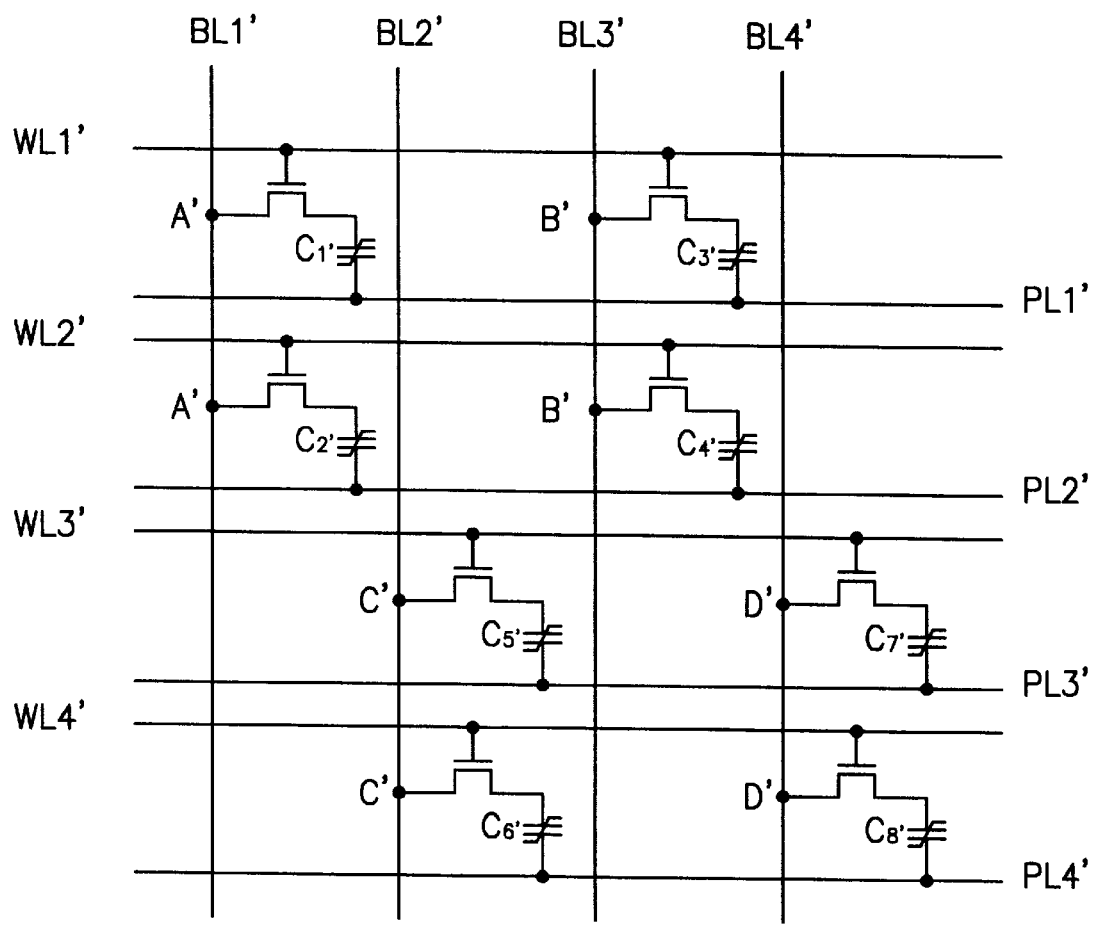
FIG. 4A is a circuit diagram a FeRAM cell array based on a cell structure shown in FIG. 2.

FIG. 4A is a circuit diagram illustrating a FeRAM cell array having a folded bit line architecture, in which one word line is corresponded to one plate line. Compared with the conventional FeRAM cell array as shown FIG. 3A, the number of the plate lines is doubled. According to the present invention, however, the FeRAM cell array having the folded bit line architecture can be implemented without increasing the chip size. In FIG. 4A, reference numerals A', B', C40 and D' represent bit (line contacts, BL1' to BL4' bit lines, WL1' to WL4' word lines, PL1' to PL4' plate lines.

Figure 4B:
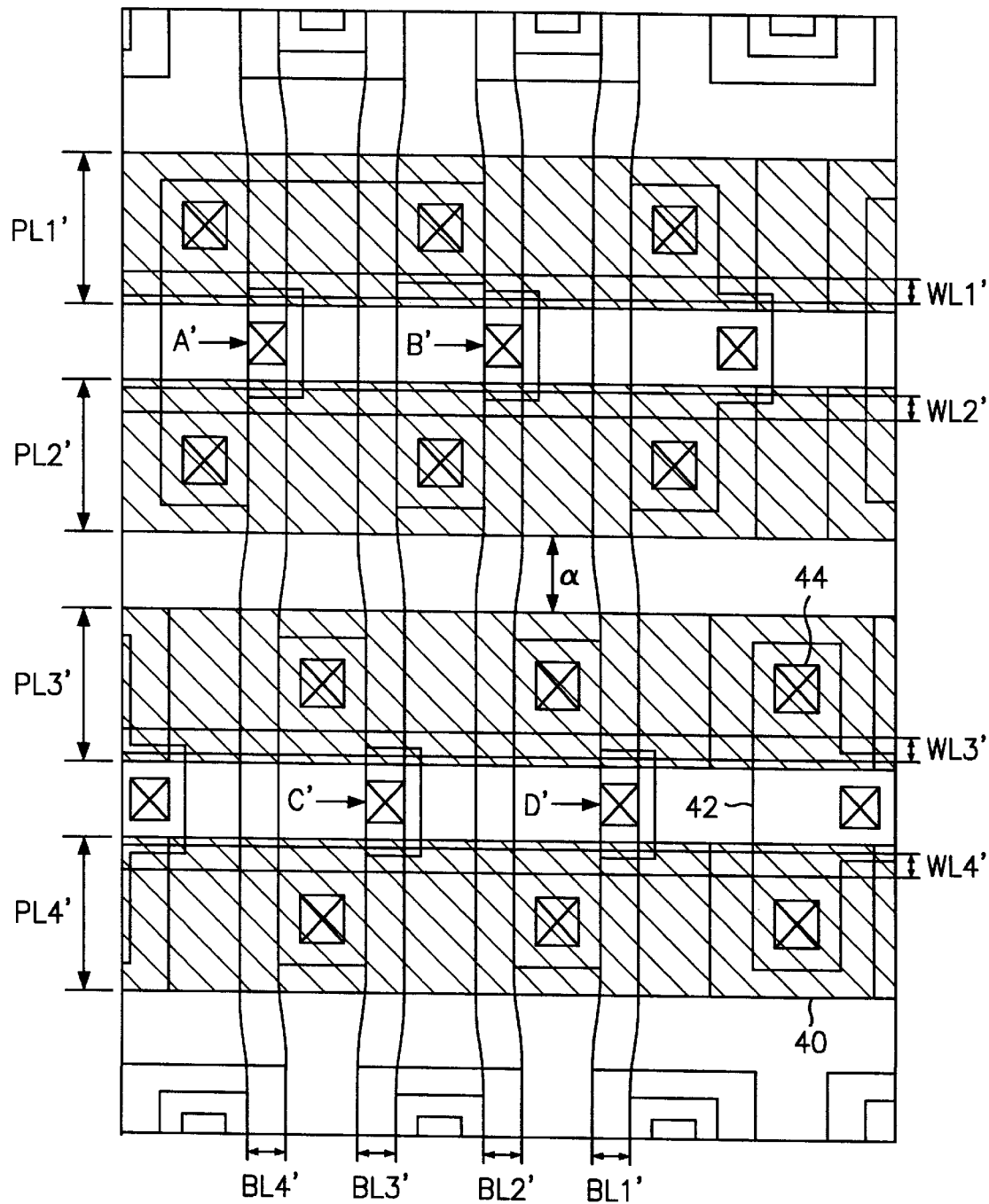
FIG. 4B is a diagram illustrating a layout of a FeRAM cell array shown in FIG. 4A in accordance with the present invention.
Figure 5A:
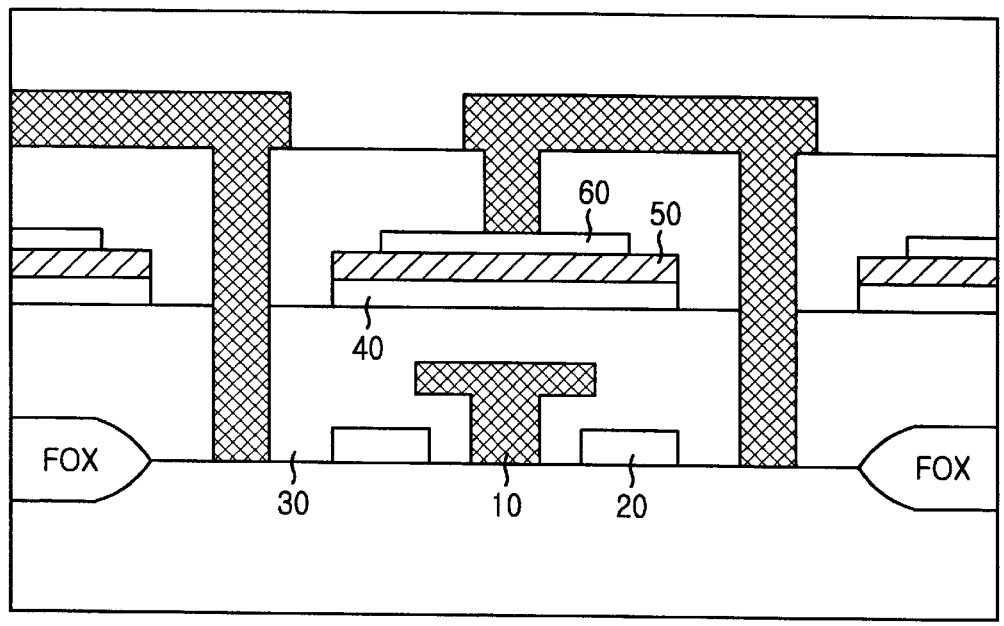
FIGS. 5A and 5B are cross-sectional views illustrating a FeRAM.
Figure 5B:
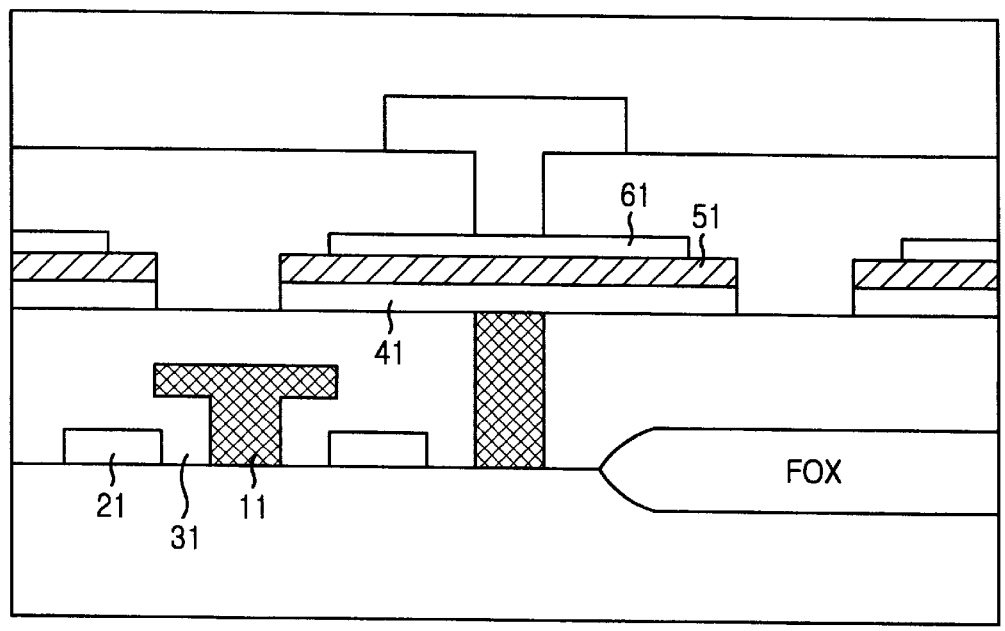

FIG. 4B is a layout diagram illustrating a FeRAM cell array as shown in FIG. 4A. In FIG. 4B, a reference number 40' represents a storage node, 42' an active region, 44' a storage node contact and α a minimum pitch between the plate lines. FIGS. 5A and 5B is cross-sectional views of the FeRAM in accordance with the present invention.

Referring to FIGS. 4A and 4B, 5A and 5B, the ferroelectric memory device includes a plurality of groups of active areas having two memory cells, wherein each active area contained in a group is equally spaced at a predetermined interval. Further, a plurality of pairs of conductive lines are arranged in a parallel fashion and each conductive line have a word line and a plate line, wherein a pair of the word line and the plate line are isolated through an insulating layer. At this time, each group of the active areas are coupled to each pair of the conductive lines, wherein a pair of the conductive lines are spaced at a predetermined interval from another pair of the conductive liner. The predetermined interval is determined by a minimum pitch α.

A plurality of bit lines are arranged in a parallel fashion and perpendicular to the conductive lines. At this time, each active area coupled to a pair of the conductive lines is coupled to an odd bit line, and each active area coupled to another pair of the conductive lines adjacent to the pair of the conductive lines is coupled to an even bit line.

Each memory cell includes also a bit line contact 10 connected to a bit line, an insulating layer 20 deposited on the bit line contact 10 and a bottom electrode 30 formed on the insulating layer 20, a ferroelectric dielectric layer 40, and a top electrode 50, as shown in FIG. 5A. At this time, the bottom electrode is connected to the plate line and the top electrode 50 is used as a storage node to be connected to the bit line through the word line.

Referring to FIGS. 5B, a bottom electrode 41 formed on an insulating layer 31 can be also used as a storage node and the top electrode 61 is connected to the plate line.

While the present invention has been described with respect to certain preferred embodiments only, other modifications and variation may be made without departing from the spirit and scope of the present invention as set forth in the following claims.

What is claimed is:

1. A ferroelectric memory device, comprising:

a plurality of groups of active areas, each active area having two memory cells; and a plurality of pairs of a word line and a plate line arranged in a parallel fashion, wherein the word line and the plate line are isolated through an insulating layer, wherein each group of the active areas is respectively coupled to two pairs of the word and the plate lines, and each of memory cells of each active areas contained in the group is respectively coupled to each of said two pairs of the word and plate lines.

2. The ferroelectric memory device as recited in claim 1, further comprising a plurality of bit lines arranged in a parallel fashion and perpendicular to the word and the plate lines, wherein each active area coupled to a pair of the word and the plate lines is coupled to an odd bit line, and each active area coupled to another pair of the word and the plate lines adjacent to said pair of the word and the bit lines is coupled to an even bit line.

3. The ferroelectric memory as recited in claim 2, wherein each memory cell includes:

a bit line;

an insulating layer deposited on the bit line; and a bottom electrode formed on the insulating layer and connected to the plate line.

4. The ferroelectric memory as recited in claim 2, wherein each active area includes two memory cell, each memory cell having:

a bit line;

an insulating layer deposited on the bit line;

a bottom electrode formed on the insulating layer;

a ferroelectric dielectric layer; and a top electrode formed on the ferroelectric dielectric layer and connected to the plate line.

5. The ferroelectric memory device as recited in claim 3, wherein each active area contained in a group is spaced from adjacent active areas at a predetermined interval.

6. The ferroelectric memory device as recited in claim 4, wherein each active area contained in a group is spaced from adjacent active area at a predetermined interval.

7. The ferroelectric memory device as recited in claim 5, wherein a pair of the word and the plate lines is spaced at a predetermine interval from another pair of the word and the plate lines.

8. The ferroelectric memory device as recited in claim 6, wherein a pair of the conductive lines is spaced at a predetermined interval from another pair of the conductive lines.

9. The ferroelectric memory device as recited in claim 7, wherein the predetermined interval is determined by a minimum pitch of memory size.

10. The ferroelectric memory device as recited in claim 8, wherein the predetermined interval is determined by a minimum pitch of memory size.

* * * * *